United States Patent
Terada et al.

[19]

[11] Patent Number: 5,999,051
[45] Date of Patent: Dec. 7, 1999

[54] VARIABLE GAIN AMPLIFICATION CIRCUIT HAVING A CIRCUIT FOR CONTROLLING A BIAS CURRENT

[75] Inventors: Yukihiro Terada; Masaru Takeuchi, both of Atsugi, Japan

[73] Assignee: Mitsumi Electric Co., Ltd., Tokyo, Japan

[21] Appl. No.: 09/048,741

[22] Filed: Mar. 26, 1998

[30] Foreign Application Priority Data

Mar. 31, 1997 [JP] Japan ................................ 9-080980

[51] Int. Cl.$^6$ ........................................................ H03F 3/45
[52] U.S. Cl. .......................... 330/254; 330/278; 330/285; 330/261
[58] Field of Search .................................. 330/254, 255, 330/278, 285, 261

[56] References Cited

U.S. PATENT DOCUMENTS 5,668,501  9/1997  Venes ........................................ 330/254
5,751,190  5/1998  Nguyen et al. ........................... 330/254

Primary Examiner—Michael B Shingleton
Attorney, Agent, or Firm—Ladas & Parry

[57] ABSTRACT

A variable gain amplification circuit can increase a dynamic range without increasing an offset voltage. The variable gain amplification circuit amplifies an input signal by a desired gain. An amplification circuit amplifies the input signal by a predetermined gain based on a bias current. A bias current control circuit controls the bias current based on a level of the input signal. The bias current supplied to the amplification circuit can be reduced when there is no input signal, and the bias current increases as the level of the input signal increases. Thus, an offset voltage can be decreased while a sufficient dynamic range is maintained.

5 Claims, 7 Drawing Sheets

VARIABLE GAIN AMPLIFICATION CIRCUIT HAVING A CIRCUIT FOR CONTROLLING A BIAS CURRENT

BACKGROUND OF THE INVENTION

1. Field of the Invention

The present invention relates to a variable gain amplification circuit and, more particularly, to a variable gain amplification circuit which amplifies an input signal by a desired gain and outputs the amplified input signal.

2. Description of the Related Art

FIG. 1 shows a circuit diagram of a conventional variable gain amplification circuit.

The conventional variable gain amplification circuit 1 shown in FIG. 1 comprises an input amplification circuit 3, a variable amplification circuit 4 and an output amplification circuit 5. The input amplification circuit 3 amplifies an input signal supplied by an input signal source 2 via an input resistor Ri. The variable amplification circuit 4 amplifies the amplified input signal from the input amplification circuit 3 by a desired gain. The output amplification circuit 5 amplifies the amplified signal from the variable amplification circuit 4, and outputs the amplified signal.

The input amplification circuit 3 comprises an operational amplifier 31, a constant current source 32 and a transistor Q1. The input signal is input to an inversion input terminal of the operational amplifier 31 and a center voltage of the input signal is input to a non-inversion input terminal of the operational amplifier 31 so that a difference is output to a base of the transistor Q1.

The transistor Q1 comprises a PNP transistor. A constant current is provided to an emitter of the transistor Q1 from the constant current source 32. A collector of the transistor Q1 is connected to the variable amplification circuit 4. A junction between the constant current source 32 and the transistor Q1 is connected to the inversion input terminal of the operational amplifier 31.

The variable amplification circuit 4 comprises NPN transistors Q11 through Q18, constant current sources 41 and 42 and a variable voltage source 43. The variable amplification circuit 4 amplifies the input signal provided from the input amplification circuit 3 by a gain corresponding to a voltage provided by the variable voltage source 43, and supplies the amplified input signal to the output amplification circuit 5.

The output amplification circuit 5 comprises an operational amplifier 51 and an output resistor Ro. The output of the variable amplification circuit 4 is provided to an inversion input terminal of the available amplification circuit 4, and a center voltage of the output signal is input to a non-inversion input terminal of the variable amplification circuit 4. The output amplification circuit 5 outputs a signal obtained by inverting and amplifying the signal supplied by the variable amplification circuit 4.

FIG. 2 shows a graph for explaining an operation of the conventional variable gain amplification circuit 1.

In the conventional variable gain amplification circuit 1, an output current of the input amplification circuit 3 is provided to an input of the output amplification circuit 5 via transistors Q11 and Q12 which form a current mirror circuit and a transistor Q14. When an amplitude of the input signal is at the maximum, a constant current I1 output from the constant current source 32 is provided to the input of the output amplification circuit 5. Accordingly, the maximum output voltage of the output amplification circuit 5 is a product of a value of the output resistor Ro and a value of the output current I1. That is, the maximum output voltage Vmax is determined by the following relationship.

$$Vmax = Ro \times I1$$

Accordingly, in the variable amplification circuit 4, the maximum output voltage Vmax is determined by the current I1. Additionally, a sum of the current I1 and currents flowing in the transistors Q14 and Q16 is supplied to the output resistor Ro when the amplitude is at a maximum. Thus, a sum of the currents flowing in the transistors Q14 and Q16 flows to the output resistor Ro as an error, which results in generation of an offset voltage.

However, in order to increase an output dynamic range of the conventional variable gain amplification circuit 1, either the value of the current I1 or the resistance of the output resistor Ro must be increased. Accordingly, there is a problem in that the offset voltage is increased and a distortion is generated in the signal when either the value of the current I1 or the resistance of the resistor Ro is increased.

SUMMARY OF THE INVENTION

It is a general object of the present invention to provide an improved and useful variable gain amplification circuit in which the above-mentioned problems are eliminated.

A more specific object of the present invention is to provide a variable gain amplification circuit which can increase a dynamic range without increasing an offset voltage.

In order to achieve the above-mentioned objects, there is provided according to the present invention a variable gain amplification circuit for amplifying an input signal by a desired gain, the variable gain amplification circuit comprising:

an amplification circuit amplifying the input signal by a predetermined gain based on a bias current; and a bias current control circuit controlling the bias current based on a level of the input signal.

According to the above-mentioned invention, the bias current supplied to the amplification circuit can be reduced when there is no input signal, and the bias current increases as the level of the input signal increases. Thus, an offset voltage can be decreased while a sufficient dynamic range is maintained.

In one embodiment of the present Invention, the amplification circuit may comprises a first mirror circuit outputting a first current corresponding to a first input current input thereto;

a second mirror circuit outputting a second current corresponding to a second input current input thereto;

a first transistor having a collector from which the first input current is pulled in;

a second transistor having a collector from which the second input current is pulled in, the second transistor outputting an output signal;

a third transistor having a collector to which an output current of the first current mirror circuit is supplied;

a fourth transistor having a collector to which an output current of the second current mirror circuit is supplied, the input signal being input to the fourth transistor;

a variable voltage source providing a voltage corresponding to the predetermined gain to a base of each of the first, second, third and fourth transistors;

a fifth transistor, connected to an emitter of the first and second transistors, having a base connected to a base connected to the bias current control circuit so as to pull a bias current corresponding to a signal supplied by the bias current control circuit; and a sixth transistor, connected to an emitter of the third and fourth transistors, having a base connected to a base connected to the bias current control circuit so as to pull a bias current corresponding to a signal supplied by the bias current control circuit.

According to this invention, a base voltage of each of the fifth and sixth transistors is controlled by the bias current control circuit so that the bias current of the first through fourth transistors can be reduced when there is no Input signal. Thus, the bias current can be increased as the input signal is increased. Accordingly, an offset voltage can be reduced while a dynamic range is maintained.

Additionally, the bias current control circuit may comprises:

a constant current source providing a constant current;

a seventh transistor having an emitter connected to the constant current source and a base provided with the input signal;

an eighth transistor having an emitter connected to the constant current source and a base provided with the input signal;

first and second resistors connected between a collector of the seventh transistor and a collector of the eight transistor, the first and second transistors connected in series to each other;

a ninth transistor having a collector connected to a junction between the collector of the seventh transistor and the first resistor, the ninth transistor also having a base connected to a junction between the first resistor and the second resistor; and a tenth transistor having a collector connected to a junction between the collector of the eighth transistor and the second resistor, the tenth transistor also having a base connected to a junction between the first resistor and the second resistor, wherein the a base of the sixth transistor is connected to a junction between the collector of the seventh transistor, a collector of the ninth transistor and the first resistor, and a base of the fifth transistor is connected to a junction between the collector of the eighth transistor, a collector of the tenth transistor and the second resistor.

Accordingly, the seventh transistor is turned off when the level of the input signal is increased. Thus, a voltage across each of the first and second resistors is reduced, and thereby the collector current of each of the ninth and tenth transistor is decreased. Consequently, the base voltage of each of the fifth and sixth transistors in the amplification circuit is increased, resulting in an increase in the bias current of the amplification circuit. On the other hand, the seventh transistor is turned on when the level of the input signal is decreased. Thus, a voltage across each of the first and second resistors is increased, and thereby the collector current of each of the ninth and tenth transistor is increased. Consequently, the base voltage of each of the fifth and sixth transistors in the amplification circuit is decreased, resulting in a decrease in the bias current of the amplification circuit. Accordingly, the bias current provided to the amplification circuit when there is no input signal, and the bias current is increased in response to an increase in the level of the input signal. Thus, an offset voltage can be reduced while a sufficient dynamic range is maintained.

Additionally, the amplification circuit may comprise:

eleventh and twelfth transistors each having a collector to which the input signal is provided;

thirteenth and fourteenth transistors each having a collector connected to an output terminal;

a variable voltage source connected to a base of each of the first, second, third and fourth transistors so as to control a gain of the input signal;

a fifteenth transistor having an emitter connected to an emitter of each of eleventh and thirteenth transistors, the fifteenth transistor having a base provided with the bias current control signal by the bias current control circuit; and a sixteenth transistor having an emitter connected to an emitter of each of twelfth and fourteenth transistors, the sixteenth transistor having a base provided with the bias current control signal by the bias current control circuit.

Accordingly, the base voltage of each of the fifteenth and sixteenth transistors is controlled by the bias current control circuit, and the bias current of each of the eleventh through fourteenth transistors can be reduced when there is no input signal. Thereby, the bias current is increased as the level of the input signal is increased. Thus, an offset voltage can be reduced while the dynamic range is maintained.

Additionally, the bias current control circuit may comprise:

a differential amplifying circuit detecting a difference between a level of the input signal and a center voltage of a variable voltage range of the input signal; and a control circuit controlling the bias current of the amplification circuit so that the bias current is proportional to the difference.

Accordingly, the bias current provided to the amplification circuit can be reduced when there is no input signal, and the bias current can be increased in response to an increase in the level of the input signal. Thus, an offset voltage can be reduced while a sufficient dynamic range is maintained.

Other objects, features and advantages of the present invention will become more apparent from the following detailed description when read in conjunction with the accompanying drawings.

DETAILED DESCRIPTION OF THE PREFERRED EMBODIMENTS

A description will now be given, with reference to FIG. 3, of a variable gain amplification circuit according to a first embodiment of the present invention.

Figure 1:
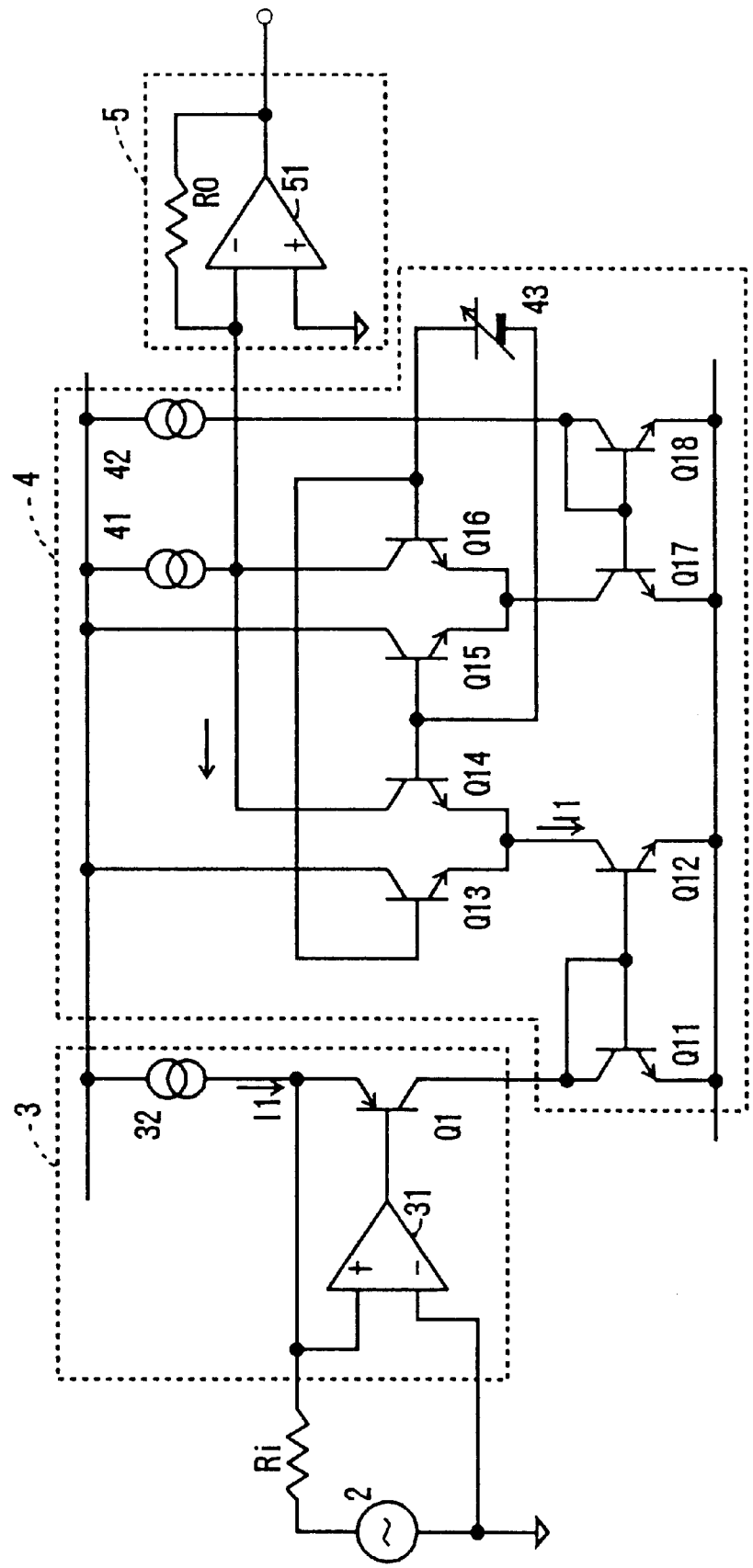
FIG. 1 is a circuit diagram of a conventional variable gain amplification circuit.
Figure 2:
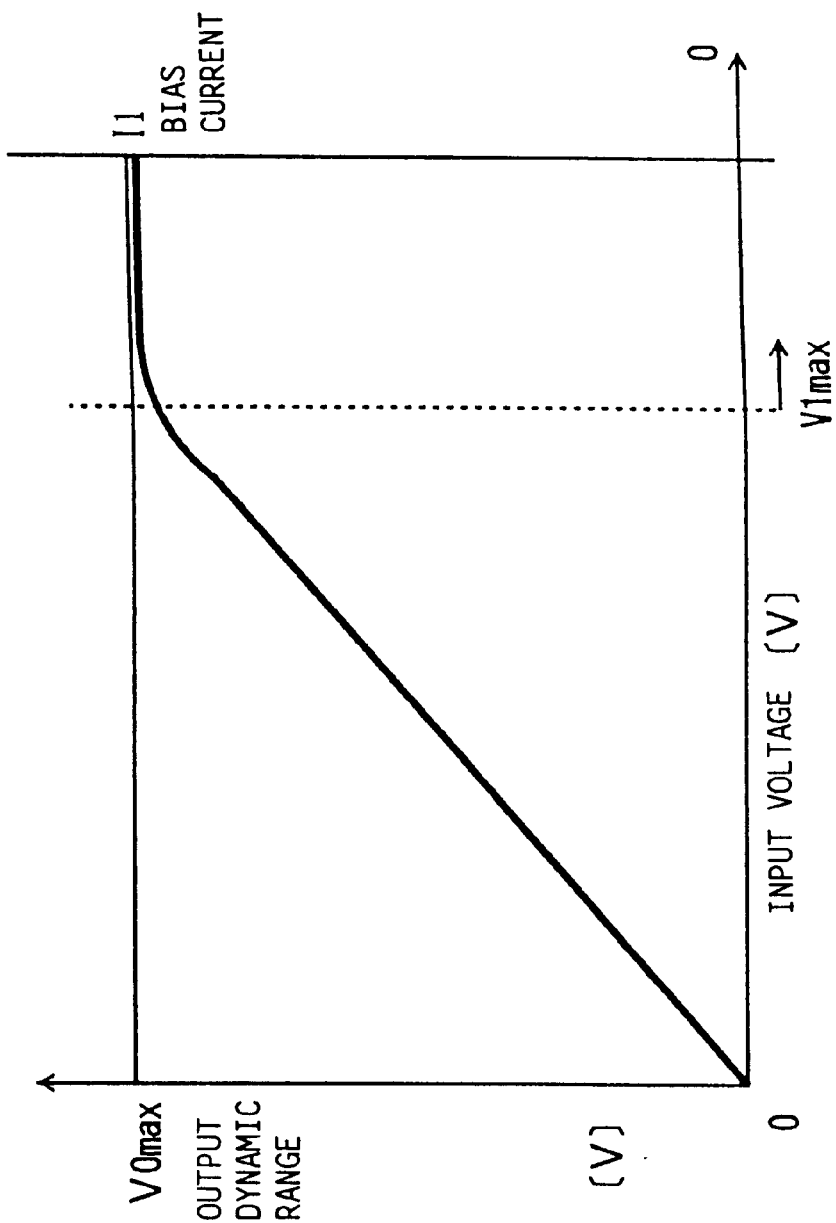
FIG. 2 is a graph showing an input and output characteristic of the conventional variable gain amplification circuit shown in FIG. 1.
Figure 3:
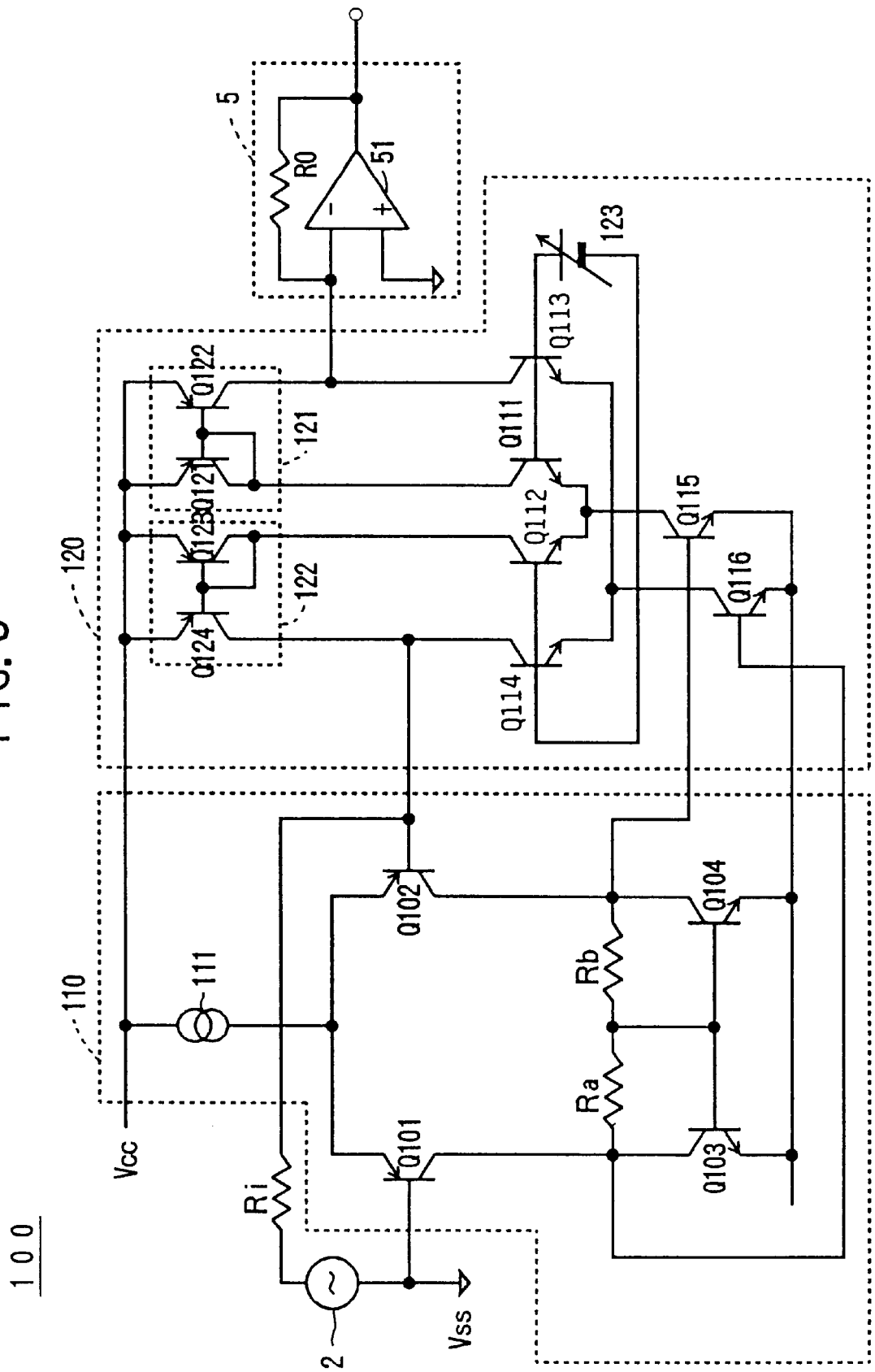
FIG. 3 is a circuit diagram of a variable gain amplification circuit according to a first embodiment of the present invention.

FIG. 3 shows a circuit diagram of the variable gain amplification circuit 100 according to the first embodiment of the present invention. In FIG. 3, parts that are the same as the parts shown in FIG. 1 are given the same reference numerals, and descriptions thereof will be omitted.

The variable gain amplification circuit 100 according to the first embodiment of the present invention comprises the output amplification circuit 5, a bias current control circuit 110 and an amplification circuit 120. The bias current control circuit 110 and the amplification circuit 120 are provided on the input side of the output amplification circuit 5.

The bias current control circuit 110 comprises a constant current source 11, PNP transistors Q101 and Q102, NPN transistors Q103 and Q104 and resistors Ra and Rb.

The constant current source 111 is provided with a supply voltage Vcc. The constant current source 11 generates a constant current by the supply voltage Vcc and supplies the constant current to an emitter of each of the transistors Q101 and Q102. The transistor Q101 corresponds to the seventh transistor. The transistor Q101 has an emitter connected to the constant current source 11, a base connected to a reference potential terminal of the input signal source 2 so that a reference voltage Vss is provided thereto, and a collector connected to a collector of the transistor Q103.

The transistor Q102 corresponds to an eighth transistor. The transistor Q102 has an emitter connected to the constant current source 111 and the emitter of the transistor Q101, a base provided with the input signal from the input signal 2 via the input resistor 2, and a collector connected to a collector of the transistor Q104.

The transistor Q103 corresponds to the ninth transistor. The transistor Q103 has the collector connected to the collector of the transistor Q101 and one end of the resistor Ra, an emitter which is grounded, and a base connected to a base of the transistor Q104 and a junction between the resistor Ra and the resistor Rb.

The transistor Q104 corresponds to the tenth transistor. The transistor Q104 has the collector connected to the collector of the transistor Q102 and one end of the resistor Rb, an emitter which is grounded, and a base connected to a base of the transistor Q103 and a junction between the resistor Ra and the resistor Rb.

The resistor Ra corresponds to a first resistor.

One end of the resistor Ra is connected to the junction between the collector of the transistor Q101 and the collector of the transistor Q103, and the other end of the resistor Ra is connected to an end of the resistor Rb and the base of each of the transistors Q103 and Q104. The resistor Rb corresponds to the second resistor. One end of the resistor Rb is connected to the junction between the collector of the transistor Q102 and the collector of the transistor Q104, and the other end of the resistor Rb is connected to the end of the resistor Ra and the base of each of the transistors Q103 and Q104.

In the amplification circuit 120, the bias current is controlled based on a bias current control signal generated by the bias current control circuit 110.

The amplification circuit 120 comprises current mirror circuits 121 and 122, NPN transistors Q11 through Q116 and a variable voltage source 123.

The current mirror circuit 121, which corresponds to a first current mirror circuit, comprises PNP transistors Q121 and Q122. The current mirror circuit 121 is driven by the supply voltage Vcc so as to provide a current corresponding to a collector current of the transistor Q111 to the collector of the transistor Q113.

The current mirror circuit 122, which corresponds to the second current mirror circuit, comprises PNP transistors Q123 and Q124. The current mirror circuit 122 is driven by the supply voltage Vcc so as to provide a current corresponding to a collector current of the transistor Q112 to the collector of the resistor Q114.

The transistor Q111 corresponds to the first transistor. The transistor Q111 has a collector connected to a collector of the transistor Q121 that is a current input terminal of the current mirror circuit 121. The transistor Q111 also has an emitter connected to a collector of the transistor Q115. The transistor Q112 corresponds to the second transistor. The transistor Q112 has a collector connected to a collector of the transistor 123 which is a current input terminal of the current mirror circuit 121. The transistor Q112 also has an emitter connected a junction between a collector of the transistor which supplies the bias current and an emitter of the transistor Q111.

The transistor Q113 corresponds to the third transistor. The transistor Q113 has a collector connected to a collector of the transistor Q122 which is a current output terminal of the current mirror circuit 121. The collector of the transistor Q122 is also connected to an input of the output amplification circuit 5. The transistor Q113 also has an emitter connected to a collector of the transistor Q116 that supplies the bias current. The transistor Q114 corresponds to the fourth transistor. The transistor Q114 has a collector connected to a collector of the transistor Q124 which is a current output terminal of the current mirror circuit 122. The transistor Q114 also has an emitter connected to a junction between a collector of the transistor Q116 and an emitter of the transistor Q113.

A base of each of the transistors Q111 and Q112 is connected to a positive terminal of the variable voltage source 123, and a base of each of the transistors Q113 and Q114 is connected to a negative terminal of the variable voltage source 123. The variable voltage source 123 is provided for adjusting an output amplitude, that is, the amplitude of the output signal is controlled by adjusting an output voltage of the variable voltage source 123.

The transistor Q115 corresponds to the fifth transistor. The transistor Q115 has an emitter which is grounded and a collector connected to a junction between the collector of the transistor Q111 and a collector of the transistor Q112. A base of the transistor Q115 is connected to a junction between the collector of the transistor Q102 which is an output terminal of the bias control signal of the bias current control circuit 110, a collector of the transistor Q104 and an end of the resistor Rb. The transistor Q116 controls the bias current of the transistors Q113 and Q114 by controlling a collector current thereof based on a potential at the junction between the collector of the transistor Q102, the collector of the transistor Q104 and the end of the resistor Rb.

The transistor Q116 corresponds to the sixth transistor. The transistor Q116 has an emitter which is grounded and a collector connected to a junction between the collector of the transistor Q113 and a collector of the transistor Q114. A base of the transistor Q116 is connected to a junction between the collector of the transistor Q101 which is an output terminal of the bias control signal of the bias current control circuit 110, a collector of the transistor Q103 and an end of the resistor Ra. The transistor Q115 controls the bias current of the transistors Q113 and Q114 by controlling a collector current thereof based on a potential at the junction between the collector of the transistor Q101, the collector of the transistor Q103 and the end of the resistor Ra.

A description will now be given of an operation of the variable gain amplification circuit 100.

When there is no input signal from the input signal source 2, substantially the same current flows to each of the transistors Q101 and Q102, and approximately one half of the bias current flows to each of the transistors Q115 and Q116.

When the input signal is increased, a base voltage of the transistor Q102 is increased. Since the transistor Q102 is a PNP transistor, the collector current is decreased when the base voltage is increased. When the collector current of the transistor Q102 is decreased, the collector current of the transistor Q101 is increased, which results in an increase in the base voltage of the transistor. Since the transistors Q115 and Q116 are NPN transistors, a collector current of each of the transistors Q115 and Q116 is increased when the base voltage is increased. That is, the bias current of each of the transistors Q113 and Q114 is increased.

Figure 4:
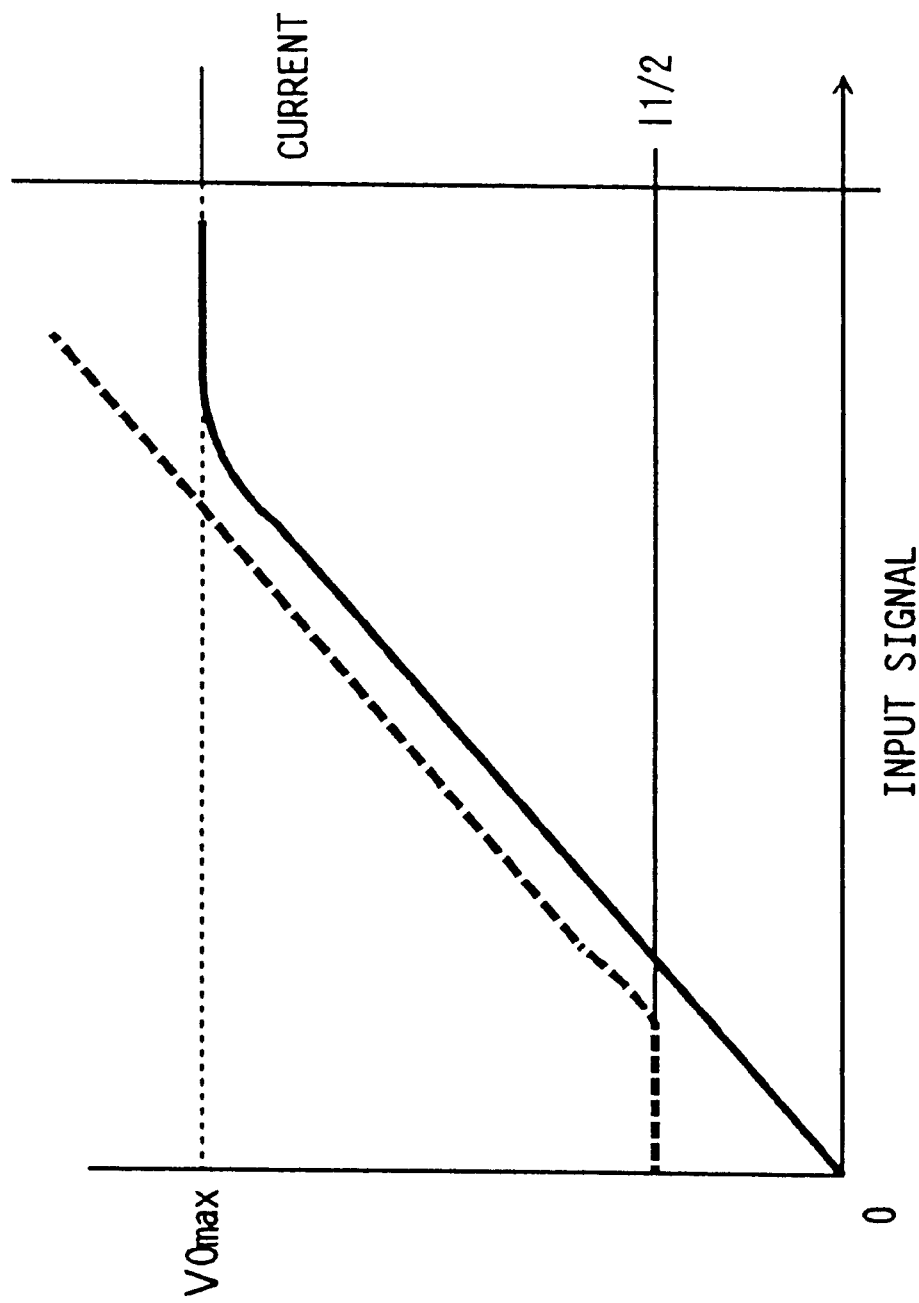
FIG. 4 is a graph showing an input and output characteristic of the variable gain amplification circuit shown in FIG. 3.

FIG. 4 shows a graph for explaining an operation of the variable gain amplification circuit 100 according to the first embodiment of the present invention. In FIG. 4, a solid bold line indicates an output voltage, and a dotted bold line indicates a bias current.

As shown in FIG. 4, the output voltage increases as a level of the input signal increases. Accordingly, for example, when the base voltage of the transistor Q115 is increased by the bias current control circuit 110, the collector current of the transistor Q115, that is, the bias current of each of the transistors Q111 and Q112, is increased as indicated by the dotted bold line of FIG. 4.

It should be noted that an operation of the transistor Q116 is reverse to the operation of the transistor Q115.

As mentioned above, according to the present embodiment, since the bias current can be decreased when there is no input signal, and the bias current can be increased as the level of the input signal is increased, an offset can be minimized while a dynamic range of the input signal is maintained. Additionally, since the bias current is reduced when this barely input signal, a noise is barely amplified which achieves a high S/N ratio.

A description will now be given, with reference to FIG. 5, of a second embodiment of the present invention.

Figure 5:
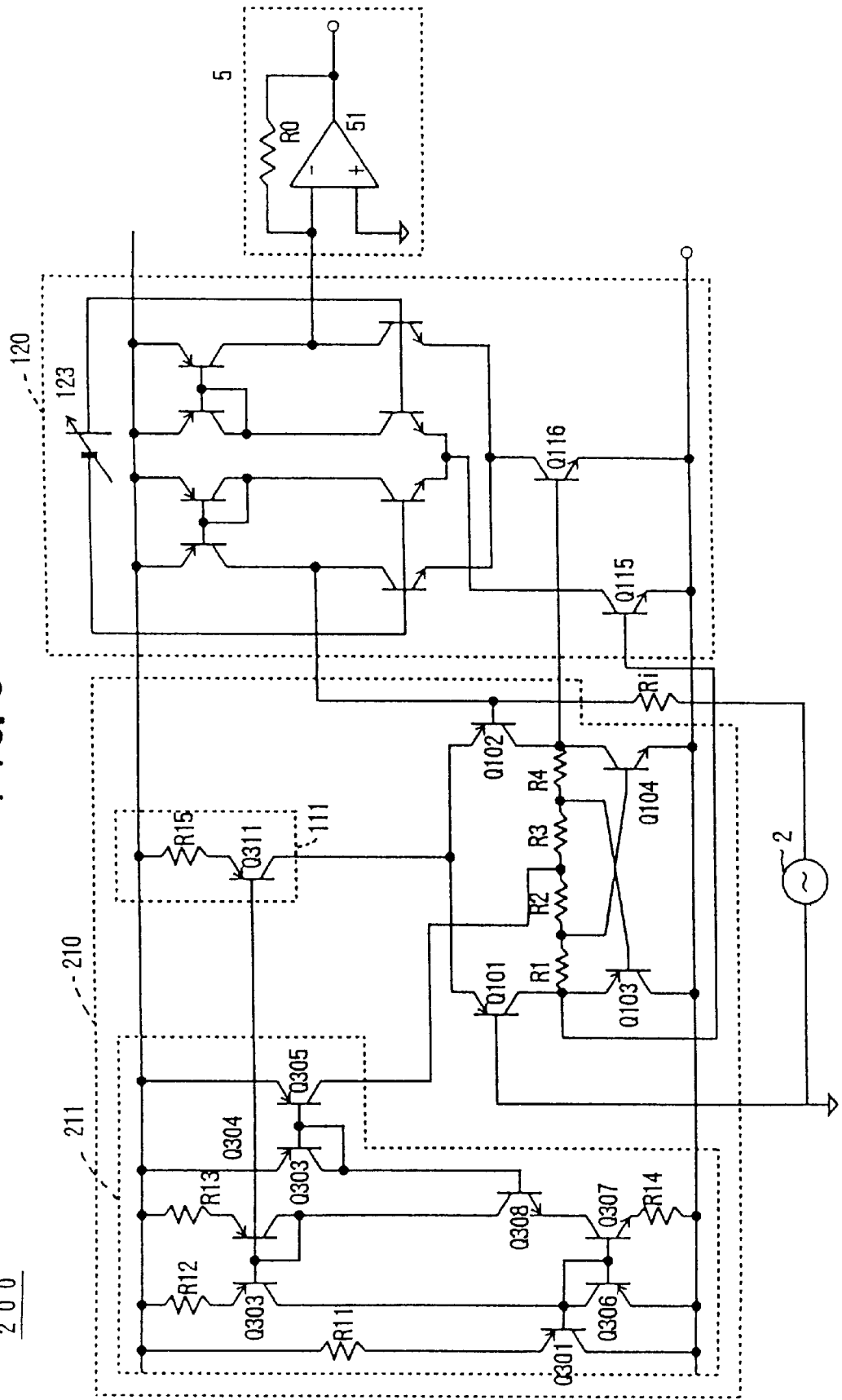
FIG. 5 is a circuit diagram of a variable gain amplification circuit according to a second embodiment of the present invention.

FIG. 5 is a circuit diagram of a variable gain amplification circuit according to the second embodiment of the present invention. In FIG. 5, parts that are the same as the parts shown in FIG. 5 are given the same reference numerals, and description thereof will be omitted.

The variable gain amplification circuit 200 shown in FIG. 5 has the same structure as the variable gain amplification circuit 100 according to the first embodiment of the present invention except for a circuit structure of the bias current control circuit 210.

The bias current control circuit 210 of the variable gain amplification circuit 200 is provided with resistors R1 through R4 instead of the resistors Ra and Rb shown in FIG. 3 so as to supply a constant current to a center point of the resistors R1 through R4. Thereby, the base voltage of each of the transistors Q103 and Q104 is corrected and also a crossover distortion is corrected.

The base of the transistor Q103 is connected to a junction between the resistor R3 and the resistor R4. The base of the transistor Q104 is connected to a junction between the resistor R1 and the resistor R2. A constant current is supplied to each of the resistor R2 and the resistor R3. A constant current generating circuit 211 provided in the bias current control circuit 210 comprises resistors R11 through R14, PNP transistors Q301 through Q305 and NPN transistors Q306 through Q308. The constant current generating circuit 211 supplies a constant current to the junction between the resistor R2 and the resistor R3.

Additionally, a constant current source 111 is also provided in the bias current control circuit 210 so as to supply a constant current to the emitter of each of the transistors Q101 and Q102. The constant current source 111 comprises a resistor R15 and a PNP transistor Q311. The constant current source 111 generates the constant current by connecting a base of the transistor Q311 to a base of each of the transistors Q302 and Q303 of the constant current generating circuit 211.

According to the present embodiment, since a range of variation in the bias current can be increased, a large dynamic range can be achieved.

A description will now be given, with reference to FIG. 6, of a variable gain amplification circuit according to a third embodiment of the present invention.

Figure 6:
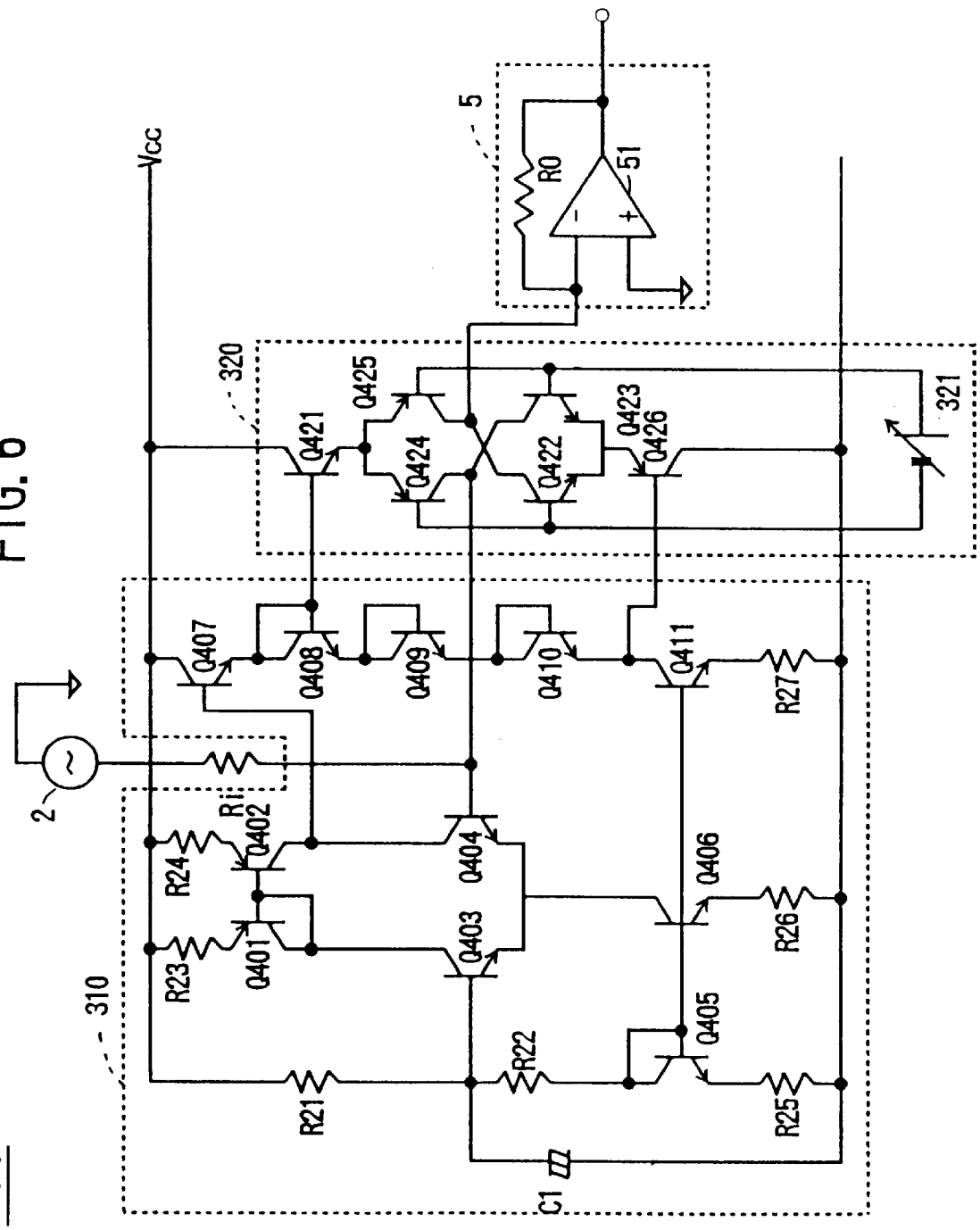
FIG. 6 is a circuit diagram of a variable gain amplification circuit according to a third embodiment of the present invention.

FIG. 6 is a circuit diagram of the variable gain amplification circuit according to the third embodiment of the present invention. In FIG. 6, parts that are the same as the parts shown in FIG. 5 are given the same reference numerals, and descriptions thereof will be omitted.

The present embodiment achieves the present invention by using a class AB amplifier.

The variable gain amplification circuit 300 shown in FIG. 6 comprises a bias current control circuit 310, an amplification circuit 320 and the output amplification circuit 5.

The bias current control circuit 310 controls the bias current of the amplification circuit 320 in response to the input signal. The bias current control circuit 310 comprises PNP transistors Q401 and Q402, NPN transistors Q403 through Q411, resistors R21 through R27 and a capacitor C1.

The transistor Q405, the resistors R21, R22 and R25 and the capacitor C1 together constitute a constant voltage circuit. Additionally, the transistors Q401 through Q404 and Q406, the resistors R23, R24 and R26 together form a differential amplification circuit. The differential amplification circuit compares a constant voltage generated by the constant voltage circuit with the input signal supplied by the input signal source 2 so as to supply a signal corresponding to a difference therebetween a base of the transistor Q407.

The transistor Q407 has an emitter connected to the amplification circuit 320. The emitter of the transistor Q407 is also connected to a collector and a base of the transistor Q408. The transistor Q408 constitutes a current mirror circuit together with transistors for supplying the bias current to the amplification circuit 320. The transistor Q408 supplies a current corresponding to the differential signal output from the above-mentioned differential amplification circuit to a collector of the transistor Q411 via the transistors Q409 and Q410. The transistors Q409 and Q410 are diode-connected in a normal direction. The transistor Q411 has an emitter grounded via the resistor R27. The transistor Q411 constitutes a constant current circuit together with the transistors Q405 and Q406 so as to pull in the constant current. A junction between an emitter of the transistor Q410 and a collector of the transistor Q411 is connected to a base of the transistor for pulling in the bias current of the amplification circuit 320.

The amplification circuit 320 controls the bias current in accordance with a bias current control signal from the bias current control circuit 310 so as to amplify the input signal by a desired gain and to supply the amplified input signal to the output amplification circuit 5. The amplification circuit 320 comprises NPN transistors Q421 through Q423, PNP transistors Q424 through Q426 and a variable voltage source 321.

The transistors Q421 and Q426 are provided for controlling the bias current. A base of each of the transistors Q421 and Q426 is connected to the bias current control circuit 310 so that the bias current is supplied thereto. The transistors Q422 through Q425 amplify the input signal.

Each of the transistors Q422 through Q425 has a base connected to the variable voltage source 321, and amplifies the input signal by a gain corresponding to a voltage generated by the variable voltage source 321.

According to the present embodiment, when there is no input signal, the level of the input signal is substantially the same as the constant current generated by the constant voltage current formed by the transistor Q405, the resistors R21, R22 and R25 and the capacitor C1. Thus, the output of the differential amplification circuit, which is constituted by the transistors Q401 through Q404 and Q406 and the resistors R23, R24 and R26, is decreased. Thereby, the transistors Q421 and Q426 are turned off, and the bias current is reduced.

Additionally, when the level of the input signal is increased, the level of the output of the differential amplification circuit constituted by the transistors Q401 through Q404 and Q406 and resistors R23, R24 and R26 is increased. Thus, an emitter current of the transistor Q407 is decreased, and the transistors Q421 and Q426 are turned off, resulting in an increase in the bias current. At this time, the base voltage of the transistor Q404 is maintained to be equal to a base voltage of the transistor Q403. That is, an operation similar to a class B amplifier is achieved.

Accordingly, similar to the above-mentioned first and second embodiments, the bias current can be decreased when there is no input signal and the bias signal is increased as the level of the input signal is increased, an offset voltage can be reduced while the dynamic range of the input signal is maintained. Additionally, since the bias current is decreased when there is no input signal, a noise is barely amplified which results in a high S/N ratio.

Figure 7:
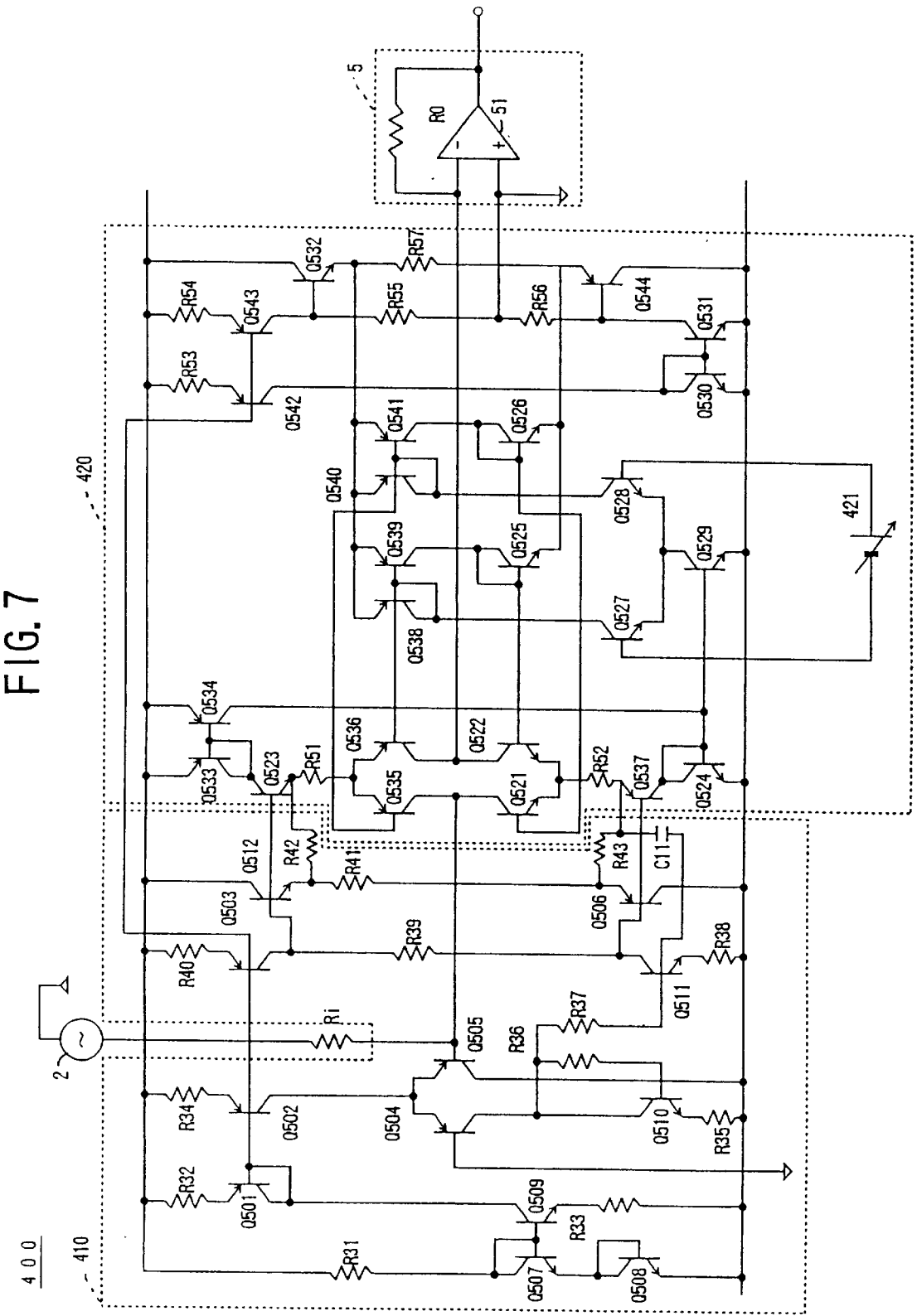
FIG. 7 is a circuit diagram of a variable gain amplification circuit according to a fourth embodiment of the present invention.

A description will now be given, with reference to FIG. 7, of a variable gain amplification circuit according to a fourth embodiment of the present invention. FIG. 7 is a circuit diagram of the variable gain amplification circuit according to the fourth embodiment of the present invention. In FIG. 7, parts that are the same as the parts shown in FIG. 6 are given the same reference numerals, and descriptions thereof will be omitted.

The variable gain amplification circuit 400 shown in FIG. 7 comprises a bias current control circuit 410, an amplification circuit 420 and the output amplification circuit 5.

The bias current control circuit 410 controls the bias current of the amplification circuit 420 in response to the input signal. The bias current control circuit 410 comprises PNP transistors Q501 through Q506, NPN transistors Q507 through Q512, resistors R31 through R43 and a capacitor C11. The bias current control circuit 410 basically constitutes a differential amplification circuit similar to the bias current control circuit 310 shown in FIG. 6. The bias current control circuit 410 compares the input signal with a center voltage of the input signal supplied by the input signal source 2, and supplies the differential voltage corresponding to a difference between the input signal and the center voltage of the input signal to the amplification circuit 420.

The amplification circuit 420 controls the bias current in accordance with a bias current control signal from the bias current control circuit 410 so as to amplify the input signal by a desired gain and supply the amplified input signal to the output amplification circuit 5. The amplification circuit 420 comprises NPN transistors Q521 through Q523, PNP transistors Q533 through Q544, resistors R51 through R57 and a variable voltage source 421.

The transistors Q523 and Q537 are provided for controlling the bias current. A base of each of the transistors Q523 and Q537 is connected to the bias current control circuit 410 so that the bias current is supplied thereto. The transistors Q521 through Q523, Q533 through Q537, the resistors R51 and R52 together constitute an amplification circuit which amplifies the input signal. A base of each of the transistors Q521, Q522, Q535 and Q536 is connected to the variable voltage source 421 via a circuit for correcting mismatch between the PNP transistors and NPN transistors. The circuit for correcting a mismatch between the PNP transistors and the NPN transistors is constituted by the transistors Q525 through Q532 and Q538 through Q544 and resistors R53 through R57, and is connected to the variable voltage source 421 which controls an amplitude of the output signal. The circuit for correcting the mismatch is also connected to an inversion input terminal of the operational amplifier 51.

The variable voltage source 421 is connected to a base of each of the transistors Q527 and Q528. Collectors of the transistors Q527 and Q528 is connected to bases of the transistors Q536 and Q535, respectively, so that the transistors Q535 and Q536 are controlled based on the voltage of the variable voltage source 421. Additionally, the collectors of the transistors Q527 and Q528 are connected to bases of the transistors Q522 and Q521, respectively, via the transistors Q538, Q539, Q540 and Q541 and the transistors Q527 and Q528 so that the transistors Q521 and Q522 are controlled based on the voltage of the variable voltage source 421.

In the above-mentioned circuit structure, voltages provided to the transistors Q525, Q526 and Q538 through Q541 are controlled to correct the mismatch between the PNP transistors and NPN transistors.

As mentioned above, similar to the abovementioned first, second and third embodiments, the bias current can be decreased when there is no input signal and the bias signal is increased as the level of the input signal is increased, an offset can be reduced while the dynamic range of the input signal is maintained. Additionally, since the bias current is decreased when there is no input signal, a noise is barely amplified which results in a high S/N ratio. Further, in the present embodiment, since the mismatch between the PNP transistors and the NPN transistors is corrected, a stable output signal is obtained.

The present invention is not limited to the specifically disclosed embodiments, and variations and modifications may be made without departing from the scope of the present invention.

What is claimed is:

1. A variable gain amplification circuit for amplifying an input signal by a desired gain, said variable gain amplification circuit comprising:

an amplification circuit amplifying said input signal by a predetermined gain based on a bias current; and a bias current control circuit controlling said bias current based on a level of said input signal wherein said amplification circuit includes two differential amplification circuits, and said bias current control circuit controls said bias current provided to each of said differential amplification circuits.

2. The variable gain amplification circuit as claimed in claim 1, wherein said gain amplification circuit comprises:

a first mirror circuit outputting a first current corresponding to a first input current input thereto;

a second mirror circuit outputting a second current corresponding to a second input current input thereto;

a first transistor having a collector from which the first input current is pulled in;

a second transistor having a collector from which the second input current is pulled in, said second transistor outputting an output signal;

a third transistor having a collector to which an output current of said first current mirror circuit is supplied;

a fourth transistor having a collector to which an output current of said second current mirror circuit is supplied, said input signal being input to said fourth transistor;

a variable voltage source providing a voltage corresponding to said predetermined gain to a base of each of said first, second, third and fourth transistors;

a fifth transistor, connected to an emitter of said first and second transistors, having a base connected to a base connected to said bias current control circuit so as to pull a bias current corresponding to a signal supplied by said bias current control circuit; and a sixth transistor, connected to an emitter of said third and fourth transistors, having a base connected to a base connected to said bias current control circuit so as to pull a bias current corresponding to a signal supplied by said bias current control circuit.

3. The variable gain amplification circuit as claimed in claim 2, wherein said bias current control circuit comprises:

a constant current source providing a constant current;

a seventh transistor having an emitter connected to said constant current source and a base provided with said input signal;

an eighth transistor having an emitter connected to said constant current source and a base provided with said input signal;

first and second resistors connected between a collector of said seventh transistor and a collector of said eight transistor, said first and second transistors connected in series to each other;

a ninth transistor having a collector connected to a junction between said collector of said seventh transistor and said first resistor, said ninth transistor also having a base connected to a junction between said first resistor and said second resistor; and a tenth transistor having a collector connected to a junction between said collector of said eighth transistor and said second resistor, said tenth transistor also having a base connected to a junction between said first resistor and said second resistor, wherein said a base of said sixth transistor is connected to a junction between said collector of said seventh transistor, a collector of said ninth transistor and said first resistor, and a base of said fifth transistor is connected to a junction between said collector of said eighth transistor, a collector of said tenth transistor and said second resistor.

4. The variable gain amplification circuit as claimed in claim 1, wherein said amplification circuit comprises:

first and second transistors each having a collector to which said input signal is provided;

third and fourth transistors each having a collector connected to an output terminal;

a variable voltage source connected to a base of each of said first, second, third and fourth transistors so as to control a gain of said input signal;

a fifth transistor having an emitter connected to an emitter of each of said first and third transistors, said fifth transistor having a base provided with said bias current control signal by said bias current control circuit; and a sixth transistor having an emitter connected to an emitter of each of said second and fourth transistors, said sixth transistor having a base provided with said bias current control signal by said bias current control circuit.

5. The variable gain amplification circuit as claimed in claim 1, wherein said bias current control circuit comprises:

a differential amplifying circuit detecting a difference between a level of said input signal and a center voltage of a variable voltage range of said input signal; and a control circuit controlling said bias current of said amplification circuit so that said bias current is proportional to said difference.

* * * * *